United States Patent
Guttmann

(10) Patent No.: US 6,243,271 B1
(45) Date of Patent: Jun. 5, 2001

(54) POSITIONER FOR POSITIONING AN ELECTRONIC CARD IN A SLOT

(75) Inventor: Baruch Guttmann, Bnei Brak (IL)

(73) Assignee: ECI Telecom Ltd., Petach Tikva (IL)

( * ) Notice: Subject to any disclaimer, the term of this patent is extended or adjusted under 35 U.S.C. 154(b) by 0 days.

(21) Appl. No.: 09/159,709

(22) Filed: Sep. 24, 1998

(51) Int. Cl.[7] .............................. H05K 7/12; H05K 7/14
(52) U.S. Cl. .......................... 361/759; 361/753; 361/801; 361/802; 24/522; 254/104; 403/409.1
(58) Field of Search .................................... 361/728, 732, 361/752–759, 797, 801, 802; 24/521–528; 254/104; 403/374, 409.1

(56) References Cited

U.S. PATENT DOCUMENTS

| 3,983,459 | 9/1976 | Passler . | |
|---|---|---|---|
| 4,444,318 | 4/1984 | Alexander . | |
| 4,589,794 | * 5/1986 | Sugiura et al. | 403/187 |
| 4,604,776 | 8/1986 | Takahashi . | |
| 4,914,552 | * 4/1990 | Kecmer | 361/801 |
| 4,969,065 | 11/1990 | Petri . | |
| 5,204,496 | 4/1993 | Boulay et al. . | |
| 5,224,016 | * 6/1993 | Weisman et al. | 361/728 |
| 5,336,110 | 8/1994 | Mosquera . | |
| 5,485,353 | * 1/1996 | Hayes et al. | 361/802 |
| 5,539,149 | 7/1996 | Gatti . | |

* cited by examiner

Primary Examiner—Jayprakash N. Gandhi
(74) Attorney, Agent, or Firm—Brown Raysman Millstein Felder & Steiner LLP

(57) ABSTRACT

A positioner for an electronic card in a slot, the positioner including a head and at least one leg, the height of the positioner being substantially equal to the width of the slot, the leg being arranged for insertion into an aperture through the electronic card, the bottom of the leg being arranged for alignment with a reference plane of the electronic card and to contact a wall of the slot. Preferably, the positioner includes two legs for insertion into a pair of apertures in an electronic card in a slot.

22 Claims, 3 Drawing Sheets

POSITIONER FOR POSITIONING AN ELECTRONIC CARD IN A SLOT

FIELD OF THE INVENTION

The present invention relates to positioners for electronic cards, in general and, in particular, to positioners for mounting electronic cards precisely in their slots.

BACKGROUND OF THE INVENTION

Electronic and communications systems generally include a chassis having a plurality of slots for receiving electronic cards, for example, printed wiring boards (PWB), also known as printed circuit boards (PCB). The cards are inserted into the slots, substantially parallel to one another. The slots are manufactured by high precision machinery and have very precise dimensions, e.g., width of tolerance ±0.05 mm. While it is possible to manufacture electronic cards having very precise thickness, it is very expensive. Hence, the thickness of the cards to be inserted into the slots generally varies greatly. For example, for a nominal thickness of 1.60 mm, the thickness of the cards can range from 1.36 mm to 1.86 mm. The result is that the cards inserted into the slots are loosely retained in the track and not precisely positioned, which is problematic in many electronic systems. In addition, the cards themselves are flexible, and can be twisted as much as 1% during the manufacturing. This problem is particularly serious in high frequency telecommunications systems, where inaccurate seating between adjacent cards can cause random air gaps and consequent radio frequency interference (RFI) problems.

There are known in the art a number of spacer elements which serve to hold adjacent cards affixed to one another at a predetermined distance, such as those shown in U.S. Pat. Nos. 3,983,459 and 4,444,318, and 4,604,776. These maintain a fixed minimum distance between adjacent cards, but are not designed to provide, and do not ensure, consistent alignment.

There are also known retention elements for retaining the cards in their slots, such as a ball with a spring, or a leaf spring mounted on the bottom and/or top of the card. These devices provide controlled spacing by pressing against the wall of the slot. However, these springs are not fixed, so they tend to wear rapidly and cease functioning under frequent insertion and removal of the card. They also lack the necessary strength to maintain a card in a fixed position, when opposed by RFI gaskets. There are also known wedges for inserting between the slot and the card to provide thermal transfer and to control vibration. But these wedges are expensive to manufacture.

Accordingly, there is a long felt need for a simple, inexpensive device to ensure precise placement of electronic cards in their slots.

SUMMARY OF THE INVENTION

According to the present invention, there is provided a positioner for an electronic card in a slot including a head and at least one leg, the height of the positioner being substantially equal to the width of the slot, the leg being arranged for insertion into an aperture through the electronic card, the bottom of the leg being arranged for alignment with a reference plane of the electronic card and to contact a wall of the slot.

According to a preferred embodiment, one of the legs is shaped to easily fit one of the apertures, thereby properly locating the positioner, and the second leg is shaped for frictional engagement of the second aperture.

According to a most preferred embodiment of the invention, the positioner is formed for blind insertion into the apertures in the electronic card.

According to another preferred embodiment, the leg of the positioner is arranged for alignment with the reference plane on the component side of the electronic card.

According to still another embodiment, the slot is narrower at the back than at the front, and the height of the positioner is substantially equal to the width of the slot near the back.

There is also provided in accordance with the present invention an electronic card for sliding into a slot, the electronic card including a board having a reference plane on the component side and on the print side, and at least one aperture through a margin of the electronic card, a positioner seated in the aperture, the positioner including a head and at least one leg, the height of the positioner being substantially equal to the width of the slot, the bottom of the leg being substantially aligned with a reference plane on the electronic card, the leg being arranged for insertion into the aperture.

There is further provided in accordance with the present invention a method for seating an electronic card in a slot including the steps of providing at least one aperture through a margin of the electronic card, and inserting a positioner including a head and at least one leg, the height of the positioner being substantially equal to the width of the slot, into the aperture until the bottom of the leg is substantially aligned with a reference plane on the electronic card.

BRIEF DESCRIPTION OF THE DRAWINGS

The present invention will be further understood and appreciated from the following detailed description taken in conjunction with the drawings in which:

FIGS. 5a and 5b are perspective views of an electronic card in and out of a slot according to an alternative embodiment of the invention; and FIG. 5c is a detail view of a portion of FIG. 5a.

DETAILED DESCRIPTION OF THE INVENTION

The present invention relates to positioner elements for electronic cards, such as circuit boards, printed wiring boards, and any other electronic system including cards arranged next to one another, which must slide in and out of slots. The positioner is designed to encure precise positioning of the card in its slot. The positioner element includes a head and preferably two legs, and is characterized in that its height is substantially identical to the width of the slot. The outer side of the head is arranged to abut against one wall of the slot, and frictionally engage it. The bottoms of the legs are arranged to align substantially with a reference plane of the electronic card, and contact the other wall of the slot, so as to provide a consistent location of each card in its respective slot.

Figure 1:
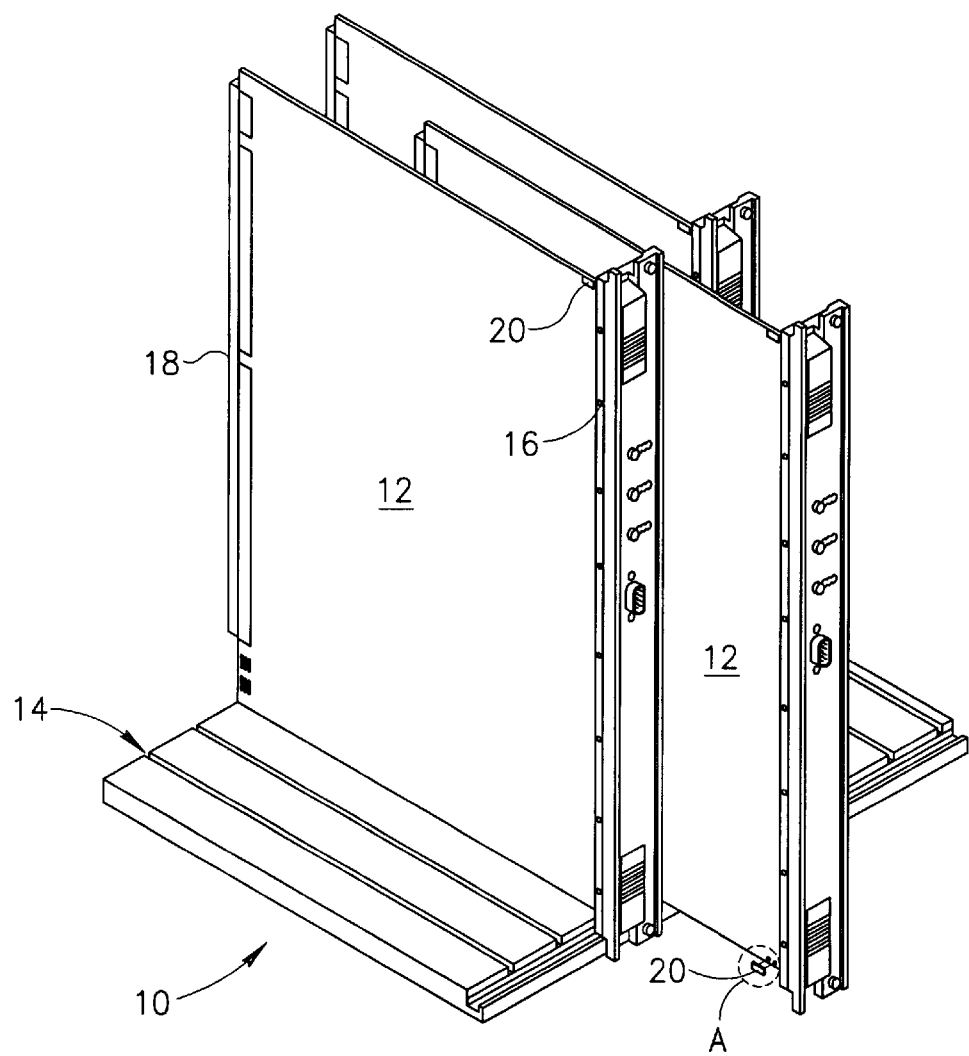
FIG. 1 is a perspective view of a plurality of electronic cards in slots including one embodiment of the positioner of the present invention.
Figure 2:
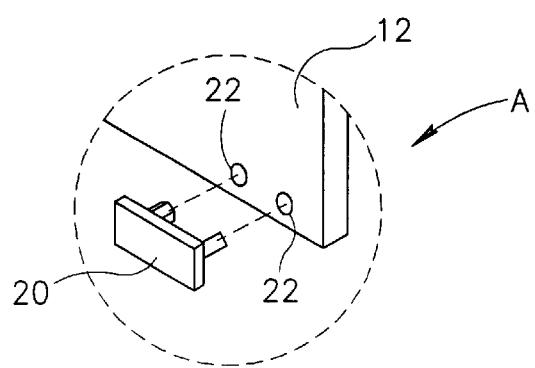
FIG. 2 is a detail view of the positioner in one electronic card of FIG. 1.

Referring now to FIG. 1, there is shown, in perspective view, a chassis 10 of an electronic system including a plurality of electronic cards 12 in slots 14. In the illustrated embodiment, shown by way of example only, the cards include a plurality of RFI gaskets 16 in their front panels, and their rear faces include plugs 18 for coupling to a motherboard. In the top and bottom margins of the cards 12 on the guide slot area near the front of the card, a positioner 20 is mounted. Each positioner 20 is inserted into a pair of apertures 22 in card 12, as can be seen in detail in FIG. 2. It is a particular feature of the invention that the positioner is mounted in a dead spot on the margin of the card, and does not require mounting on the "real estate" of the card.

Figure 3:
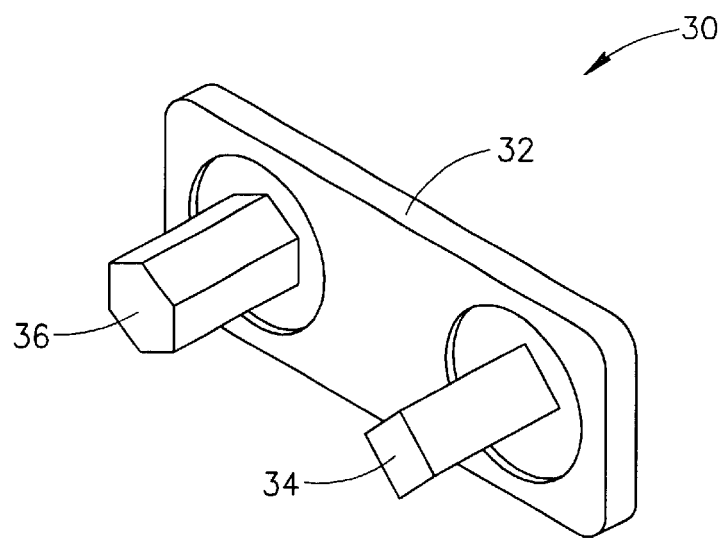
FIG. 3 is a perspective view of a positioner constructed and operative in accordance with a preferred embodiment of the present invention.

With reference to FIG. 3, there is shown a perspective view of a positioner 30 constructed and operative in accordance with a preferred embodiment of the present invention. Positioner 30 includes a head 32 and two legs 34, 36. Positioner 30 can have any number of legs. However, two legs are preferred for use in cards which are frequently inserted and removed from their slots for maintenance, testing, etc., since abrasion of the positioner can lead to loss of function. Two legs are sufficient to provide stability and prevent rotation or pivoting of the positioner during insertion and removal of the card from the slot, but not so many that insertion or card manufacture is difficult.

Figure 4:
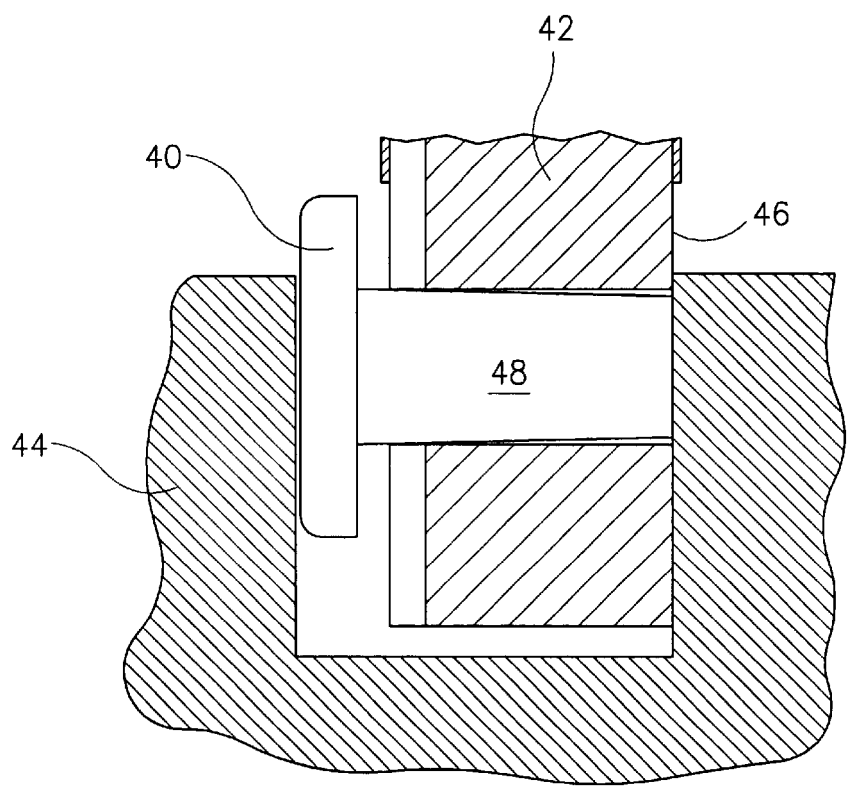
FIG. 4 is a cross-sectional view of an electronic card with the positioner according to one embodiment of the invention inserted into a slot.

It is a particular feature of this embodiment of the invention that positioner 30 is designed for blind insertion, and no fine tuning is required. Ideally, two positioners can be inserted simultaneously with a low force press, typically against an anvil. Since it is difficult to make holes of the precise shape and size of the legs, a pair of round holes are drilled through the card, and the legs are shaped to be plugged into the holes. Thus, leg 34 is designed to properly locate the positioner and prevent its rotation relative to the card, while leg 36 is shaped so as to frictionally engage its corresponding aperture, preventing inadvertent removal of positioner 30 from the card. As can be seen in FIG. 4, leg 36 is preferably slightly tapered or conical, widening slightly towards the head for frictional engagement of the aperture in the card.

The positioner of the present invention can be formed of any suitable material, such as plastic or metal, which can be manufactured to very specific tolerances at a relatively low price. Non-limiting examples of suitable processes include die casting, powder metallurgy, or other technique, using a zinc- or aluminum-based alloy. This flexibility permits control by the planner due to the material, the conditions of the particular system, and so on. For example, the positioner can also serve as a non-dedicated grounding pin, e.g., when plated through holes are used, or as a thermal conductor, if formed of suitable materials. Similarly, the positioner can have many different shapes, as required in the particular system.

Operation of the positioner of the present invention is illustrated in FIG. 4, a side sectional detail view of a positioner 40 according to the present invention in an electronic card 42 in a slot 44. As can be seen, the overall height of the positioner (from the top of the head to the bottom of the legs 48) is substantially identical to the width of the slot, and the bottoms of the legs are substantially aligned with a reference plane 46 on the electronic card and contact a wall of slot 44. This ensures that the card is always located at the desired location in the slot, and ensures proper alignment with adjacent cards. For example, in telecommunications systems, the use of the positioners of the invention permits smooth entwining between the RFI fingers with neighboring cards, and reduces the RFI leakage between the front panel sides of the cards.

By providing two such positioners, one at the top and one at the bottom, many manufacturing distortions can be compensated for. In addition, the positioners prevent flexion on the electronic card that is caused by the eccentric forces on the card during insertion and extraction. It will be appreciated that the use of positioners permits precise positioning of each card in line with one wall of the precisely manufactured slot. This serves to improve installation of the cards, and is particularly useful in high frequency telecommunications systems where it provides precise alignment and more reliable sealing of the RFI gaskets on the front panels of adjacent cards. Preferably, the positioner legs are aligned with the reference plane on the component side of the card, although, alternatively, they can be aligned with the reference plane on the print side, in a printed board. Furthermore, the positioners are easily replaceable after wear, if necessary.

Figures 5A, 5B, 5C:
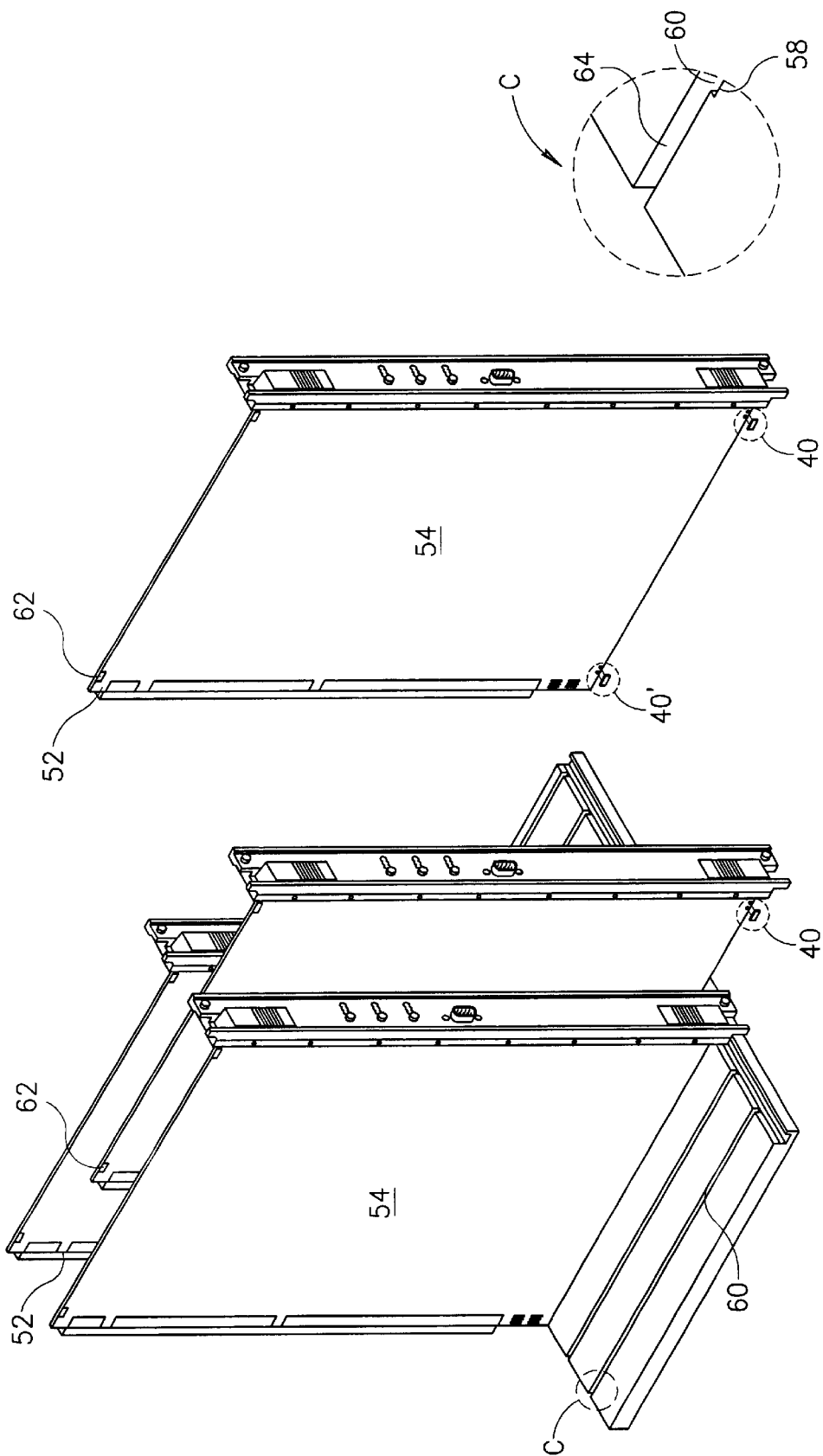

When it is desired to increase the precision of the card's coupling to its connector, as on a mother board, a second pair of positioners 40' can be provided near the back edge 52 of the electronic card 54, as shown schematically in FIGS. 5a, 5b and 5c, respective perspective and detail views of an alternative embodiment of electronic cards in slots according to the invention. These positioners help to guide the back edge of the card towards the corresponding connector (not shown) in the proper orientation. In order to precisely align the card with the corresponding connector, slot 60 is wider towards the front, and narrower near the connector. In order not to interfere with free and rapid insertion of the card into its slot, the slot can be designed to include a step or shoulder 58, or the slot can merely narrow gradually. Different tolerances can be provided for the width of the slot at the front and the back.

In the embodiment of FIGS. 5a, 5b and 5c, the overall height of the positioner (from the top of the head to the bottom of the legs ) is substantially identical to the width of the slot 60 near the connector, and the bottoms of the legs are substantially aligned with a reference plane 62 on the electronic card and contact a wall 64 of slot 60. This permits easy and rapid insertion of the card into the slot, while ensuring that the card is precisely located relative to its connector. It will be appreciated that where the positioning of the front panel sides of the card need not be precise, it is sufficient to provide one pair of positioners 40' on the inner edge of the card to ensure precise positioning relative to the connector, and the outer pair of positioners is not required.

It is a particular feature of the present invention that the reference plane of the electronic system becomes the wall of the slot, rather than the center line. Since the positioner is substantially the width of the slot, and the reference plane of the electronic card is held against the wall of the slot, the actual width of the card is irrelevant. The tolerance in the thickness of a Printed Wiring Board, for example, can be up to ±15% (nominal base material) for single, double and multi-layers. Thus, the card can be fixed in a desired location in a cage with high precision at low cost, which is not possible with conventional systems.

It will be appreciated that the invention is not limited to what has been described hereinabove merely by way of example. Rather, the invention is limited solely by the claims which follow.

What is claimed is:

1. A positioner for positioning an electronic card in a slot, the slot having a back and a front, the positioner comprising:
   a head; and
   one or more legs; wherein each of the one or more legs is
      adapted for insertion into an aperture of one or more apertures formed through the electronic card, wherein a height of the positioner is substantially identical to a width of the slot, and wherein each of the one or more legs has a top and a bottom, the bottom being further than the top from the head, and wherein the bottom is adapted for alignment with a reference plane of the electronic card and for contacting a wall of the slot, and wherein the slot is narrower at the back than at the front, and wherein the height of the positioner is substantially equal to the width of the slot near the back.

2. The positioner according to claim 1, wherein the slot includes a front portion and a shoulder merging into a back portion, said back portion being narrower than said front portion.

3. An assembly comprising:
   a chassis having at least one slot, each slot having a pair of opposing walls defining a slot width;
   an electronic card having two major surfaces, a lateral portion of one of said major surfaces, adapted to be juxtaposed against a first opposing wall of said pair of opposing walls of a slot, defining a reference plane, said electronic card including a pair of throughgoing apertures formed through a margin of said electronic card in said lateral portion; and
   a positioner including a substantially planar head defining a plane, and a pair of spaced apart legs substantially perpendicularly directed in the same direction with respect to said plane, said pair of legs having tips flush with said reference plane on insertion of said pair of legs into said pair of apertures of said electronic card from the direction of the other of said major surfaces, a height of said positioner as defined between said plane and said tips being substantially equal to said slot width whereupon, on insertion of said margin in said slot, said positioner extends widthwise across said slot and said lateral portion is juxtaposed against said first opposing wall.

4. The assembly according to claim 3 and further comprising a second positioner for insertion into a second pair of throughgoing apertures spaced apart from said first pair of throughgoing apertures along said margin of said electronic card.

5. The assembly according to claim 3 and further comprising a second positioner for insertion into a second pair of throughgoing apertures spaced apart from said first pair of throughgoing apertures along a second margin of said electronic card opposite to said first margin.

6. The assembly according to claim 3 wherein the positioner includes a first leg of said pair of legs so shaped and dimensioned to easily fit into a first aperture of said pair of apertures, thereby properly locating the positioner and preventing its rotation, and a second leg of said pair of legs so shaped and dimensioned for frictional insertion into a second aperture of said pair of apertures.

7. The assembly according to claim 3 wherein the positioner acts as a non-dedicated grounding pin.

8. The assembly according to claim 3 wherein the positioner acts as a thermal conductor.

9. A positioner for positioning an electronic card in a slot of a chassis, the slot having a pair of opposing walls defining a slot width, the electronic card having two major surfaces, a lateral portion of one of said major surfaces, adapted to be juxtaposed against a first opposing wall of the pair of opposing walls of the slot, defining a reference plane, the electronic card including a pair of throughgoing apertures formed through a margin of the electronic card in said lateral portion, the positioner comprising:
   a substantially planar head defining a plane; and
   a pair of spaced apart legs substantially perpendicularly directed in the same direction with respect to said plane, said pair of legs having tips being flush with said reference plane on insertion of said pair of legs into the pair of apertures of the electronic card from a direction of the other of said major surfaces,
   a height of the positioner as defined between said plane and said tips being substantially equal to the slot width whereupon, on insertion of the margin in the slot, the positioner extends widthwise across the slot and said lateral portion is juxtaposed against one of said pair of opposing walls.

10. The positioner according to claim 9 wherein a first leg of said pair of legs is so shaped and dimensioned to easily fit into a first aperture of said pair of apertures, thereby properly locating the positioner and preventing its rotation, and a second leg of said pair of legs is so shaped and dimensioned for frictional insertion into a second aperture of said pair of apertures.

11. The positioner according to claim 9, wherein said positioner acts as a non-dedicated grounding pin.

12. The positioner according to claim 9, wherein said positioner acts as a thermal conductor.

13. A positioner for positioning an electronic card in a slot, the slot having a first wall and a second wall, the positioner comprising:
   a head; and
   one or more legs; wherein each of the one or more legs is adapted for insertion into an aperture of one or more apertures formed through the electronic card, so as to fix the positioner to the electronic card, and such that, when the electronic card is inserted into the slot, a portion of the head engages a portion of the first wall, and such that a portion of the leg contacts a portion of the second wall.

14. The positioner of claim 13, wherein a height of the positioner is substantially identical to a width of the slot, and wherein each of the one or more legs has a top and a bottom, the bottom being further than the top from the head, and wherein the bottom is adapted for alignment with a reference plane of the electronic card and for contacting a wall of the first wall and the second wall.

15. The positioner of claim 13, wherein the one or more legs consists of a first leg and a second leg.

16. The positioner of claim 13, wherein the first leg is adapted for loose insertion into a first aperture of the one or more apertures, and wherein the second leg is adapted to frictionally engage a portion of a surface of a second aperture of the one or more apertures.

17. A positioner for positioning an electronic card in a slot, the slot being formed in a chassis and having a first wall and a second wall, and the positioner comprising:
   a head; and
   one or more legs; wherein each of the one or more legs is adapted for insertion into an aperture of one or more apertures formed through the electronic card, such that, when the electronic card is inserted into the slot, a portion of the head engages a portion of the first wall, and such that a portion of the leg contacts a portion of the second wall, and wherein the positioner is removeably insertable into the slot.

18. The positioner of claim 17, wherein a height of the positioner is substantially identical to a width of the slot, and wherein each of the one or more legs has a top and a bottom, the bottom being further than the top from the head, and wherein the bottom is adapted for alignment with a reference plane of the electronic card and for contacting a wall of the first wall and the second wall.

19. The positioner of claim 17, wherein the one or more legs consists of a first leg and a second leg.

20. The positioner of claim 19, wherein the first leg is adapted for loose insertion into a first aperture of the one or more apertures, and wherein the second leg is adapted to frictionally engage a portion of a surface of a second aperture of the one or more apertures.

21. A method for positioning an electronic card into a slot, the slot having a first wall and a second wall, the method comprising:

inserting each of one or more legs of a positioner into an aperture of one or more apertures formed in the electronic card, so as to fix the positioner to the electronic card; and then inserting the electronic card into the slot such that a portion of a head of the positioner engages a portion of the first wall, and such that a portion of the leg contacts a portion of the second wall.

22. The method of claim 21, comprising, after inserting the electronic card into the slot, removing the electronic card having the positioner fixed thereto from the slot, so as to remove the electronic card and the positioner from the slot.

* * * * *